United States Patent
Kawano et al.

(10) Patent No.: US 7,924,396 B2
(45) Date of Patent: Apr. 12, 2011

(54) COATING/DEVELOPING APPARATUS AND PATTERN FORMING METHOD

(75) Inventors: Hisashi Kawano, Koshi (JP); Junichi Kitano, Koshi (JP); Hitoshi Kosugi, Koshi (JP); Koichi Hontake, Koshi (JP); Masashi Enomoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 615 days.

(21) Appl. No.: 11/958,798

(22) Filed: Dec. 18, 2007

(65) Prior Publication Data
US 2008/0204675 A1 Aug. 28, 2008

(30) Foreign Application Priority Data
Dec. 18, 2006 (JP) .................. 2006-339567

(51) Int. Cl.
G03B 27/32 (2006.01)
G03B 5/00 (2006.01)
(52) U.S. Cl. ............... 355/27; 355/30; 396/611
(58) Field of Classification Search ............. 355/27, 355/30, 53; 396/611; 118/52; 430/311
See application file for complete search history.

(56) References Cited

U.S. PATENT DOCUMENTS

| | | | |
|---|---|---|---|
| 6,585,430 B2 * | 7/2003 | Matsuyama et al. | 396/611 |
| 2006/0159449 A1 * | 7/2006 | Yasuda et al. | 396/611 |

FOREIGN PATENT DOCUMENTS

| | | |
|---|---|---|
| JP | 7-263402 | 10/1995 |
| JP | 2000-58498 | 2/2000 |
| JP | 2001-319857 | 11/2001 |

OTHER PUBLICATIONS

English Translation of JP 2000-058498 (dated Feb. 25, 2000).*
English Translation of JP 07-263402 (dated Oct. 13, 1995).*

* cited by examiner

Primary Examiner — Alan A Mathews
(74) Attorney, Agent, or Firm — Oblon, Spivak, McClelland, Maier & Neustadt, L.L.P.

(57) ABSTRACT

A coating/developing apparatus includes a process section including processing units to perform a series of processes for resist coating and development; an interface section disposed between the process section and immersion light exposure apparatus; and a drying section disposed in the interface section to dry the substrate immediately after the immersion light exposure process. The drying section includes a process container configured to accommodate the substrate, a substrate support member configured to place the substrate thereon, a temperature-adjusted gas supply mechanism configured to supply a temperature-adjusted gas into the process container, and an exhaust mechanism configured to exhaust the process container. The drying section is arranged to dry the substrate by supplying the temperature-adjusted gas into the process container with the substrate placed on the substrate support member, while exhausting the process container.

20 Claims, 7 Drawing Sheets

COATING/DEVELOPING APPARATUS AND PATTERN FORMING METHOD

BACKGROUND OF THE INVENTION

1. Field of the Invention

The present invention relates to a coating/developing apparatus to be disposed adjacent to an immersion light exposure apparatus, and a pattern forming method for forming a predetermined resist pattern on a substrate. The immersion light exposure apparatus is arranged to subject a resist film formed on a substrate, such as a semiconductor substrate, to light exposure while immersing the resist film in a liquid. The coating/developing apparatus is arranged to apply a resist liquid onto a substrate to form a resist film, and to perform a developing process on the resist film after it is subjected to the immersion light exposure process by the immersion light exposure apparatus.

2. Description of the Related Art

In the process of manufacturing semiconductor devices, photolithography techniques are used for forming circuit patterns on semiconductor wafers. Where a circuit pattern is formed by use of photolithography, the process steps are performed, as follows. Specifically, a resist liquid is first applied to a semiconductor wafer to form a resist film. Then, the resist film is irradiated with light to perform light exposure on the resist film in accordance with the circuit pattern. Then, the resist film is subjected to a developing process.

In recent years, the integration degree of semiconductor devices becomes increasingly higher to improve the operation speed and so forth. Accordingly, photolithography techniques are required to increase the miniaturization level of circuit patterns formed on semiconductor wafers. As a photolithography technique for realizing a high resolution of a 45-nm node level, there has been proposed the following immersion light exposure (for example, see U.S. Patent Application Publication No. US 2006/0231206 A1). In this immersion light exposure, a liquid, such as purified water, having a refractive index higher than air is supplied between the semiconductor wafer and light exposure projection lens. The wavelength of light radiated from the projection lens is shortened by means of the refractive index of the liquid, so that the line width obtained by the light exposure is decreased.

In general, where a circuit pattern is formed by such immersion light exposure, liquid deposited on a wafer during the immersion light exposure may bring about development defects. Accordingly, in order to remove the deposited liquid, cleaning (rinsing) is performed by use of purified water on the wafer processed by immersion light exposure, then the wafer W is rotated by a spin chuck or the like in a horizontal state to perform throwing-off and drying of liquid.

However, where the throwing-off and drying process is performed by rotation, liquid droplets may remain and/or traces of remaining liquid droplets (stains, water marks, and so forth) may be generated on the wafer.

Further, where the throwing-off and drying process is performed by rotation, it is difficult to remove liquid components impregnated in films, such as a resist film, on the wafer.

BRIEF SUMMARY OF THE INVENTION

An object of the present invention is to provide a coating/developing apparatus and pattern forming method, which can prevent liquid droplets from remaining and/or prevent traces of remaining liquid droplets from being generated on a substrate; and a computer readable storage medium that stores a control program for executing the pattern forming method.

Another object of the present invention is to provide a coating/developing apparatus and pattern forming method, which can prevent liquid droplets from remaining and/or prevent traces of remaining liquid droplets from being generated on a substrate, and further can remove liquid components impregnated in a resist film and so forth on the substrate; and a computer readable storage medium that stores a control program for executing the pattern forming method.

According to a first aspect of the present invention, there is provided a coating/developing apparatus to be disposed adjacent to an immersion light exposure apparatus arranged to subject a resist film formed on a substrate to light exposure while immersing the resist film in a liquid, the coating/developing apparatus being used for applying a resist liquid onto the substrate to form the resist film, and for performing a developing process on the resist film treated by an immersion light exposure process in the immersion light exposure apparatus, the coating/developing apparatus comprising: a process section including a plurality of processing units configured to perform a series of processes for resist coating and development; an interface section disposed between the process section and the immersion light exposure apparatus; and a drying section disposed in the interface section and configured to dry the substrate immediately after the immersion light exposure process, wherein the drying section comprises a process container configured to accommodate the substrate, a substrate support member configured to place the substrate thereon inside the process container, a temperature-adjusted gas supply mechanism configured to supply a temperature-adjusted gas into the process container, and an exhaust mechanism configured to exhaust an interior of the process container, and the drying section is arranged to dry the substrate by supplying the gas from the temperature-adjusted gas supply mechanism into the process container with the substrate placed on the substrate support member, while exhausting the interior of the process container by the exhaust mechanism.

In the first aspect of the present invention, the temperature-adjusted gas supply mechanism may have temperature-adjusted gas supply holes formed at an upper position inside the process container to face the substrate placed on the substrate support member, such that the gas is supplied through the temperature-adjusted gas supply holes.

In the first aspect of the present invention, the substrate support member may be configured to perform heating, and the drying section may be arranged to dry the substrate by supplying the gas from the temperature-adjusted gas supply mechanism, while heating the substrate support member.

In the first aspect of the present invention, the process section may include a post-light exposure baking unit configured to perform a heating process on the substrate dried after the immersion light exposure process and before the developing process, and the drying section is preferably arranged to use a substrate process temperature lower than a substrate process temperature used in the post-light exposure baking unit.

According to a second aspect of the present invention, there is provided a coating/developing apparatus to be disposed adjacent to an immersion light exposure apparatus arranged to subject a resist film formed on a substrate to light exposure while immersing the resist film in a liquid, the coating/developing apparatus being used for applying a resist liquid onto the substrate to form the resist film, and for performing a developing process on the resist film treated by an immersion light exposure process in the immersion light exposure apparatus, the coating/developing apparatus comprising: a process section including a plurality of processing units configured to perform a series of processes for resist coating and development; an interface section disposed between the process section and the immersion light exposure apparatus; and a drying section disposed in the interface section and configured to dry the substrate immediately after the immersion light exposure process, wherein the drying section comprises a process container configured to accommodate the substrate, a substrate support member configured to place the substrate thereon inside the process container, and a pressure-decreasing mechanism configured to decrease a pressure inside the process container, and the drying section is arranged to use the pressure-decreasing mechanism to dry the substrate, by decreasing a pressure inside the process container with the substrate placed on the substrate support member.

In the second aspect of the present invention, the pressure-decreasing mechanism may have exhaust holes formed at an upper position inside the process container to face the substrate placed on the substrate support member, such that gas is exhausted through the exhaust holes to decrease a pressure inside the process container.

In the first and second aspects of the present invention, the coating/developing apparatus may further comprise a drying assistant unit disposed in the interface section and configured to supply a drying assistant medium on the substrate immediately after the immersion light exposure process and before drying by the drying section. In this case, the drying assistant medium may contain at least one of an alkyl alcohol, an ether, and ozone. The drying assistant unit may include a cleaning liquid supply mechanism configured to supply a cleaning liquid onto the substrate, and may be arranged to supply the drying assistant medium onto the substrate cleaned by the cleaning liquid supply mechanism.

Alternatively, in the first and second aspects of the present invention, the coating/developing apparatus may further comprise a post-light exposure cleaning unit disposed in the interface section and having a cleaning liquid supply mechanism configured to supply a cleaning liquid onto the substrate immediately after the immersion light exposure process and before drying by the drying section. In this case, the cleaning liquid supply mechanism may be configured to supply a cleaning liquid containing at least one of an alkyl alcohol and an ether onto the substrate. The process section may include a protection film forming unit configured to form a protection film on the resist film formed on the substrate, before the immersion light exposure process, and the cleaning liquid supply mechanism may be configured to supply the protection film formed on the substrate with a cleaning liquid having a function of decreasing a contact angle thereof or a cleaning liquid having a small surface tension. Further in this case, the cleaning liquid having a function of decreasing a contact angle of the protection film may contain at least one of heated water, an alcohol, and a liquid having a function of oxidizing the protection film, and the cleaning liquid having a small surface tension may contain a surfactant.

According to a third aspect of the present invention, there is provided a pattern forming method for forming a predetermined resist pattern on a substrate, the method comprising: applying a resist onto the substrate, thereby forming a resist film; performing immersion light exposure in accordance with a predetermined pattern on the resist film formed on the substrate, while immersing the resist film in a liquid; performing drying on the substrate immediately after the immersion light exposure; and performing development on the resist film after the drying, wherein the drying comprises supplying a temperature-adjusted gas into a process container with the substrate placed on a substrate support member therein, while exhausting the interior of the process container.

In the third aspect of the present invention, the temperature-adjusted gas may be supplied through temperature-adjusted gas supply holes formed at an upper position inside the process container to face the substrate placed on the substrate support member.

In the third aspect of the present invention, the drying may comprise supplying the temperature-adjusted gas while heating the substrate support member.

In the third aspect of the present invention, the method may further comprise performing post-light exposure baking of performing a heating process on the substrate after the drying and before the development, and the drying is preferably arranged to use a substrate process temperature lower than a substrate process temperature used in the post-light exposure baking.

According to a fourth aspect of the present invention, there is provided a pattern forming method for forming a predetermined resist pattern on a substrate, the method comprising: applying a resist onto the substrate, thereby forming a resist film; performing immersion light exposure in accordance with a predetermined pattern on the resist film formed on the substrate, while immersing the resist film in a liquid; performing drying on the substrate immediately after the immersion light exposure; and performing development on the resist film after the drying, wherein the drying comprises using pressure-decreasing to dry the substrate, by decreasing a pressure inside a process container with the substrate placed on a substrate support member therein.

In the fourth aspect of the present invention, the pressure-decreasing inside the process container may be performed by exhausting gas through exhaust holes formed at an upper position inside the process container to face the substrate placed on the substrate support member.

In the third and fourth aspects of the present invention, the method may further comprise supplying a drying assistant medium onto the substrate immediately after the immersion light exposure and before the drying. In this case, the drying assistant medium may contain at least one of an alkyl alcohol, an ether, and ozone. The method may further comprise performing cleaning by use of a cleaning liquid on the substrate immediately after the immersion light exposure and before supplying the drying assistant medium.

Alternatively, in the third and fourth aspects of the present invention, the method may further comprise performing cleaning by use of a cleaning liquid on the substrate immediately after the immersion light exposure and before the drying. In this case, the cleaning liquid may contain at least one of an alkyl alcohol and an ether. Alternatively, the method may further comprise forming a protection film on the resist film formed on the substrate, before the immersion light exposure process, and the cleaning may comprise supplying the protection film formed on the substrate with a cleaning liquid having a function of decreasing a contact angle thereof or a cleaning liquid having a small surface tension. Further in this case, the cleaning liquid having a function of decreasing a contact angle of the protection film may contain at least one of heated water, an alcohol, and a liquid having a function of oxidizing the protection film, and the cleaning liquid having a small surface tension may contain a surfactant.

According to a fifth aspect of the present invention, there is provided a computer readable storage medium that stores a control program for execution on a computer, the control program, when executed, causing the computer to control a processing apparatus to conduct one of the pattern forming methods described above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings.

Figure 1:
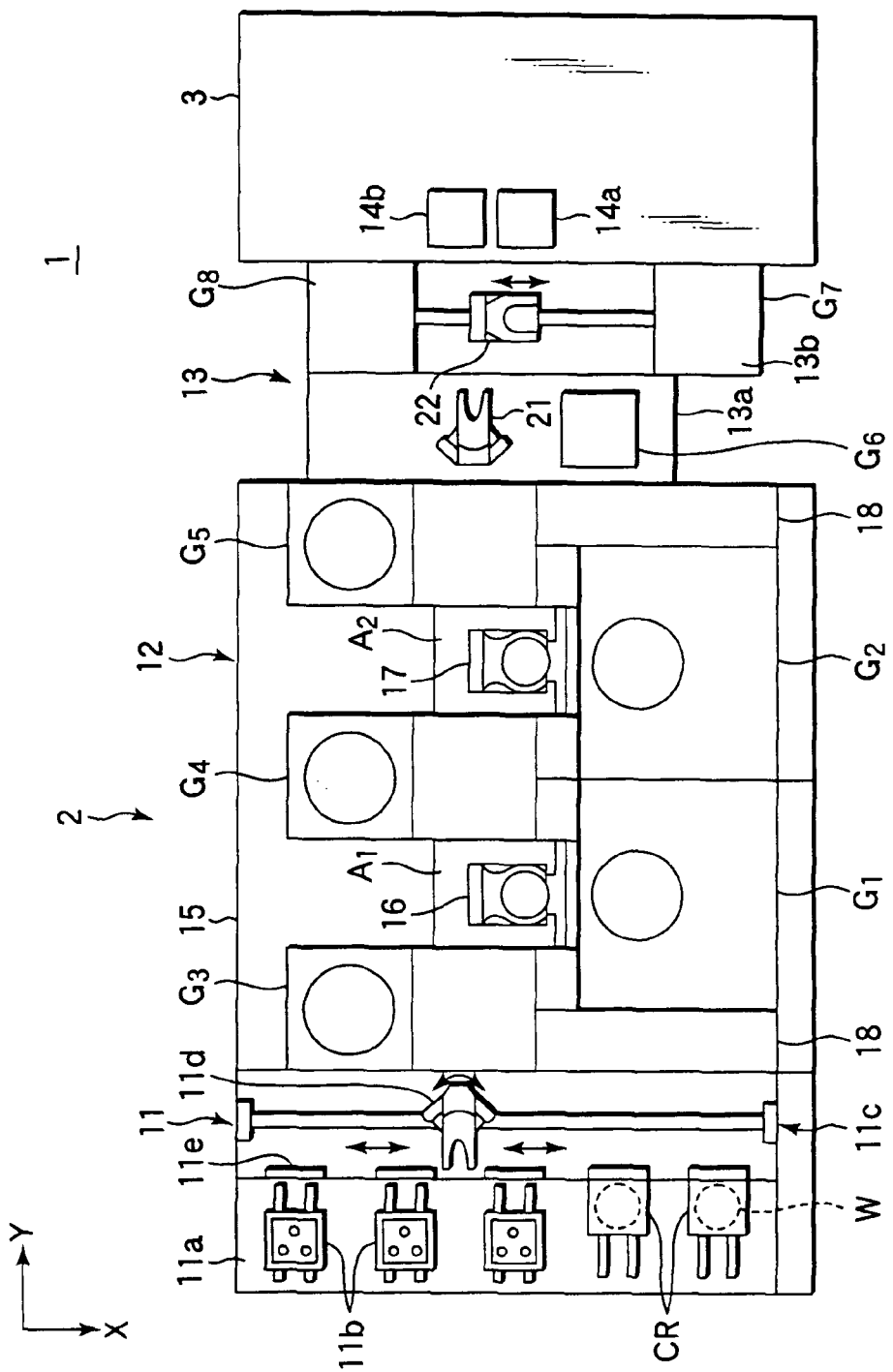
FIG. 1 is a plan view schematically showing a pattern forming system that includes a coating/developing apparatus according to an embodiment of the present invention.
Figure 2:
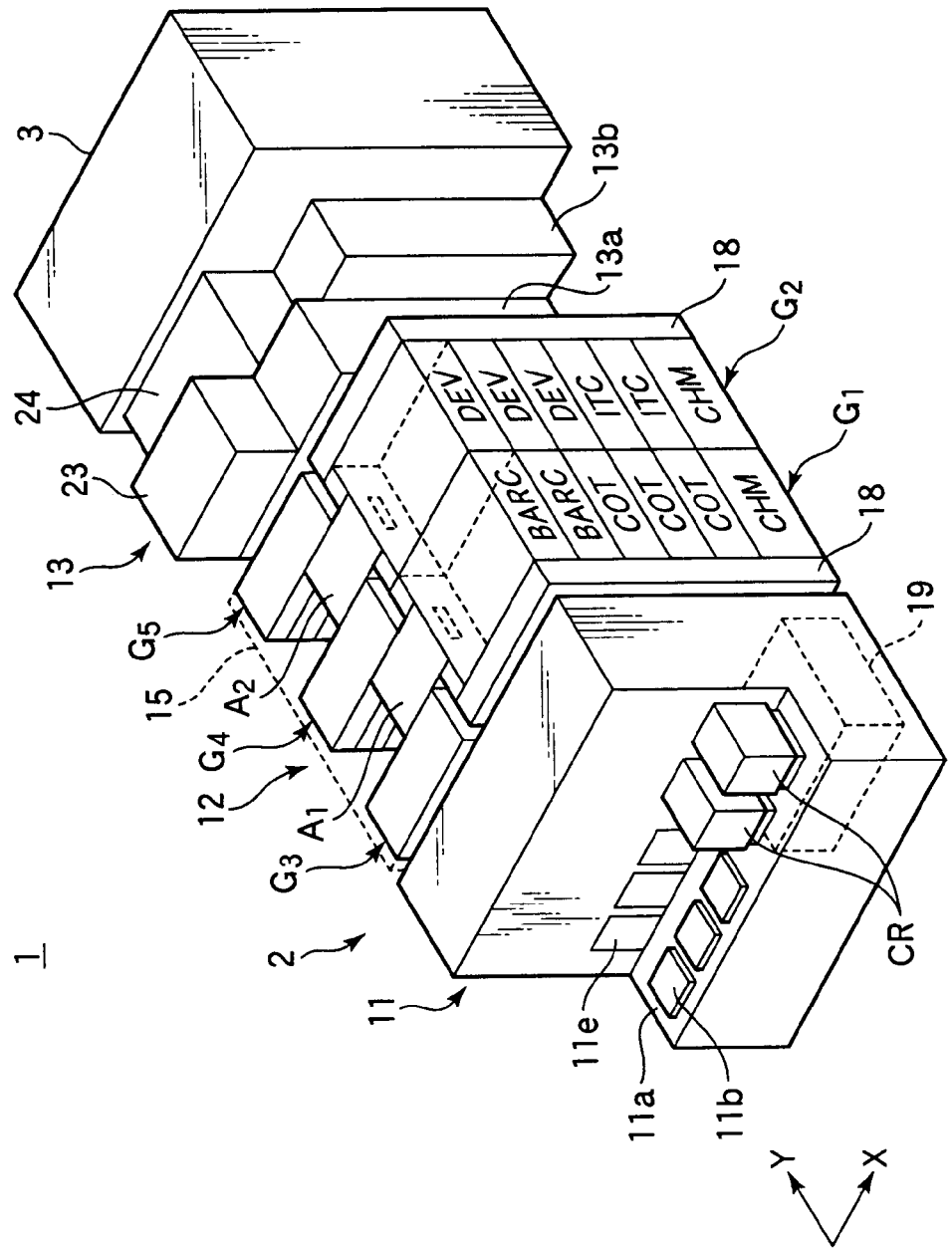
FIG. 2 is a perspective view schematically showing the pattern forming system.

FIG. 1 is a plan view schematically showing a pattern forming system that includes a coating/developing apparatus according to an embodiment of the present invention. FIG. 2 is a perspective view schematically showing the pattern forming system.

The pattern forming system 1 is designed to form a predetermined resist pattern on a semiconductor substrate or wafer W. The system includes a coating/developing apparatus 2 for applying a resist liquid onto the wafer W to form a resist film and for performing development after light exposure, and an immersion light exposure apparatus 3 for performing a light exposure process on the wafer W. The coating/developing apparatus 2 includes a cassette station 11 used as a transfer station for wafers W, a process station 12 (process section) comprising a plurality of processing units each for performing a predetermined process on a wafer W, and an interface station 13 (interface section) for transferring wafers W between the process station 12 and light exposure apparatus 3. The cassette station 11, process station 12, interface station 13, and light exposure apparatus 3 are arrayed in series in this order in the longitudinal direction of the pattern forming system 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transit unit located in a third processing unit group $G_3$ in the process station 12 described later. The cassette table 11a and wafer transfer mechanism 11c are arrayed in series in this order in the Y-direction. The cassette table 11a has a plurality of, such as 5, positioning portions lib each for positioning a wafer cassette (CR), arrayed thereon in the width direction of the pattern forming system 1 (X-direction). A wafer cassette (CR) is placed at each of the positioning portions 20a such that its transfer port faces an opening/closing portion 11e formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transit unit.

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$.

The first processing unit group $G_1$ includes a plurality of processing units stacked one on the other, which are formed of, e.g., two bottom coating units (BARC) for forming an anti-reflective coating that prevents reflection of light during light exposure on a wafer W, and three resist coating units (COT) for performing resist coating on the surface of a wafer W to form a resist film. The second processing unit group $G_2$ includes a plurality of processing units stacked one on the other, which are formed of, e.g., three development units (DEV) for developing a resist film formed on a wafer W after light exposure, and two top coating units (ITC) for supplying a protection film forming material onto the surface of a resist film formed on a wafer W to form a protection film, which is used as a liquid repellent film repellent to an immersion light exposure liquid described later.

Each of the third processing unit group $G_3$, fourth processing unit group $G_4$, and fifth processing unit group $G_5$ includes a plurality of processing units stacked one on the other, which are formed of, e.g., an adhesion unit for performing a hydrophobic process on a wafer W, a pre-baking unit for performing a heating process on a wafer W after resist coating, a post-baking unit for performing a heating process on a wafer W after development, a post-exposure baking unit for performing a heating process on a wafer W after light exposure and before development, and so forth. The third processing unit group $G_3$ includes a transit unit through which wafers W are transferred between the cassette station 11 and first main transfer section $A_1$. The fifth processing unit group $G_5$ includes a transit unit through which wafers W are transferred between the second main transfer section $A_2$ and a first wafer transfer mechanism 21 used in the interface station 13 described later.

The first main transfer section $A_1$ is provided with a first main wafer transfer arm 16 for handling wafers W, which can selectively access the units located in the first processing unit group $G_1$, third processing unit group $G_3$, and fourth processing unit group $G_4$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Temperature/humidity adjusting units 18 are respectively disposed between the first processing unit group $G_1$ and cassette station 11 and between the second processing unit group $G_2$ and interface station 13. Each of the temperature/humidity adjusting units 18 includes a temperature adjusting device for process liquids to be supplied to the first and second processing unit groups $G_1$ and $G_2$, and a duct for adjustment of temperature and humidity. Chemical unit (CHM) are respectively disposed below the first and second processing unit groups $G_1$ and $G_2$, for supplying chemical solutions to the first and second processing unit groups $G_1$ and $G_2$.

Figure 3:
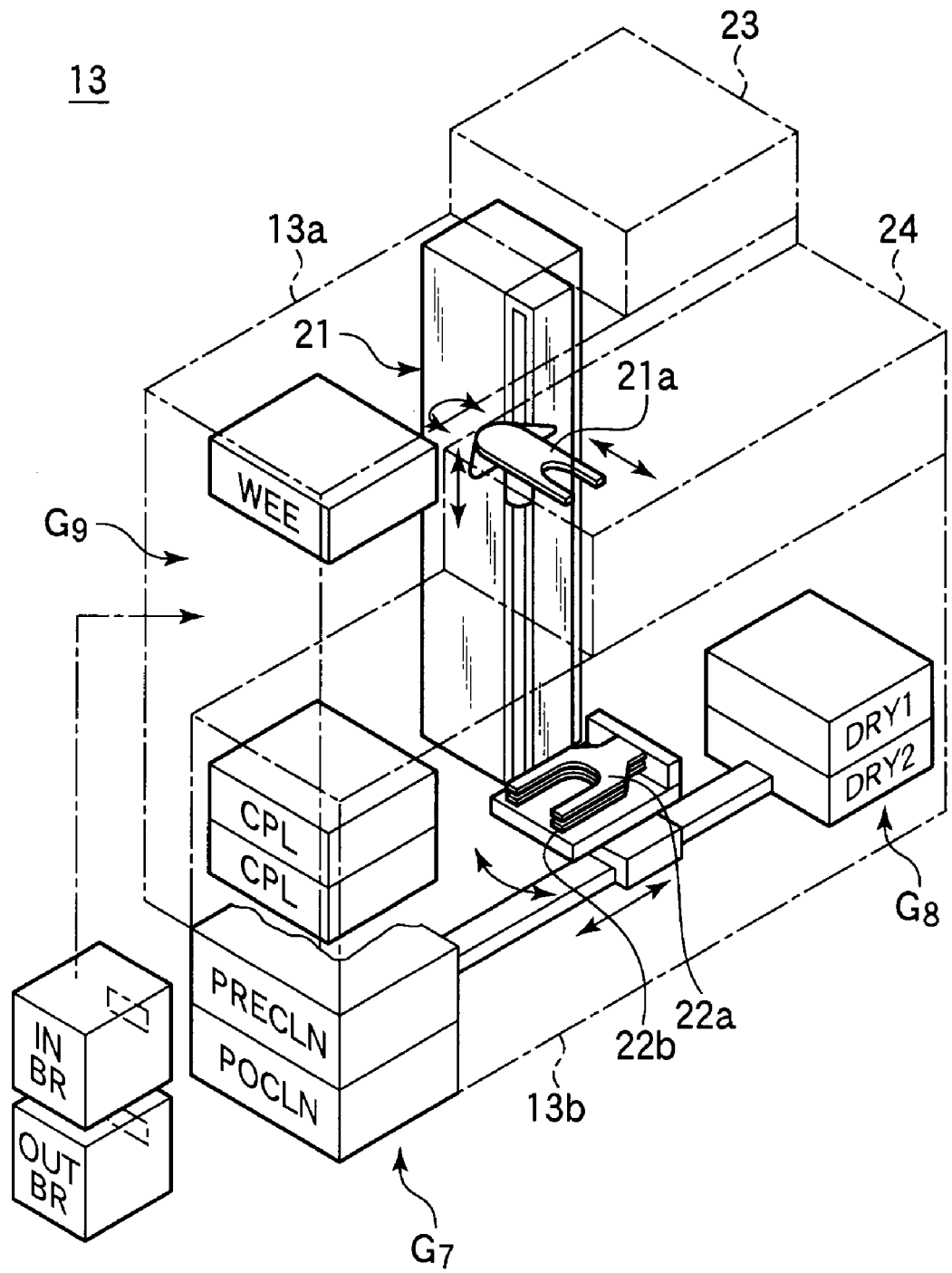
FIG. 3 is a perspective view schematically showing an interface station used in the coating/developing apparatus.

As shown in the schematic perspective view of FIG. 3, the interface station 13 has a casing that defines a first interface station 13a on the process station 12 side and a second interface station 13b on the light exposure apparatus 3 side. The first interface station 13a is provided with a first wafer transfer mechanism 21 disposed to face an opening portion of the fifth processing unit group $G_5$ for transferring wafers W. The second interface station 13b is provided with a second wafer transfer mechanism 22 for transferring wafers W.

A sixth processing unit group $G_6$ is located on the front side of the first interface station 13a, and includes a plurality of processing units stacked one on the other, which are formed of a periphery light exposure unit (WEE), an incoming buffer cassette (INBR), an outgoing buffer cassette (OUTBR), and two high-precision temperature adjusting units (CPL). The periphery light exposure unit (WEE) is used for performing light exposure selectively only on the edge portion of a wafer W to remove an unnecessary resist portion near the edge of the wafer. The incoming buffer cassette (INBR) is used for temporarily placing wafers W to be transferred to the light exposure apparatus 3. The outgoing buffer cassette (OUTBR) is used for temporarily placing wafers W transferred from the light exposure apparatus 3. The high-precision temperature adjusting units (CPL) are used for adjusting the temperature of a wafer W with high precision. The high-precision temperature adjusting units (CPL) also serve as portions through which wafers W are transferred between the first wafer transfer mechanism 21 and second wafer transfer mechanism 22.

A seventh processing unit group $G_7$ is located on the front side of the second interface station 13b, and includes two processing units stacked one on the other, which are formed of a pre-cleaning unit (PRECLN) for cleaning a wafer to be transferred to the light exposure apparatus 3, and a post-cleaning unit (POCLN) for cleaning a wafer transferred from the light exposure apparatus 3. An eighth processing unit group $G_8$ is located on the rear side of the second interface station 13b, and includes two processing units stacked one on the other, which are formed of a first drying unit (DRY1) and a second drying unit (DRY2), each for drying a wafer W processed by an immersion light exposure process in the light exposure apparatus 3. The post-cleaning unit (POCLN), first drying unit (DRY1), and second drying unit (DRY2) will be explained later in detail.

The first wafer transfer mechanism 21 includes a fork 21a for transferring wafers W. The fork 21a is movable up and down and rotatable so that it can selectively access the units located in the fifth processing unit group $G_5$ and sixth processing unit group $G_6$ to transfer wafers W between these units.

The second wafer transfer mechanism 22 includes two forks 22a and 22b on the upper and lower sides for transferring wafers W. Each of the forks 22a and 22b is horizontally movable in the X-direction shown in FIG. 1, movable up and down, and rotatable, so that it can selectively access the high-precision temperature adjusting units (CPL) of the sixth processing unit group $G_6$, the units located in the seventh processing unit group $G_7$ and eighth processing unit group $G_8$, and an incoming stage 14a and an outgoing stage 14b of the light exposure apparatus 3 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus.

Next, a detailed explanation will be given of the post-cleaning unit (POCLN).

Figure 4:
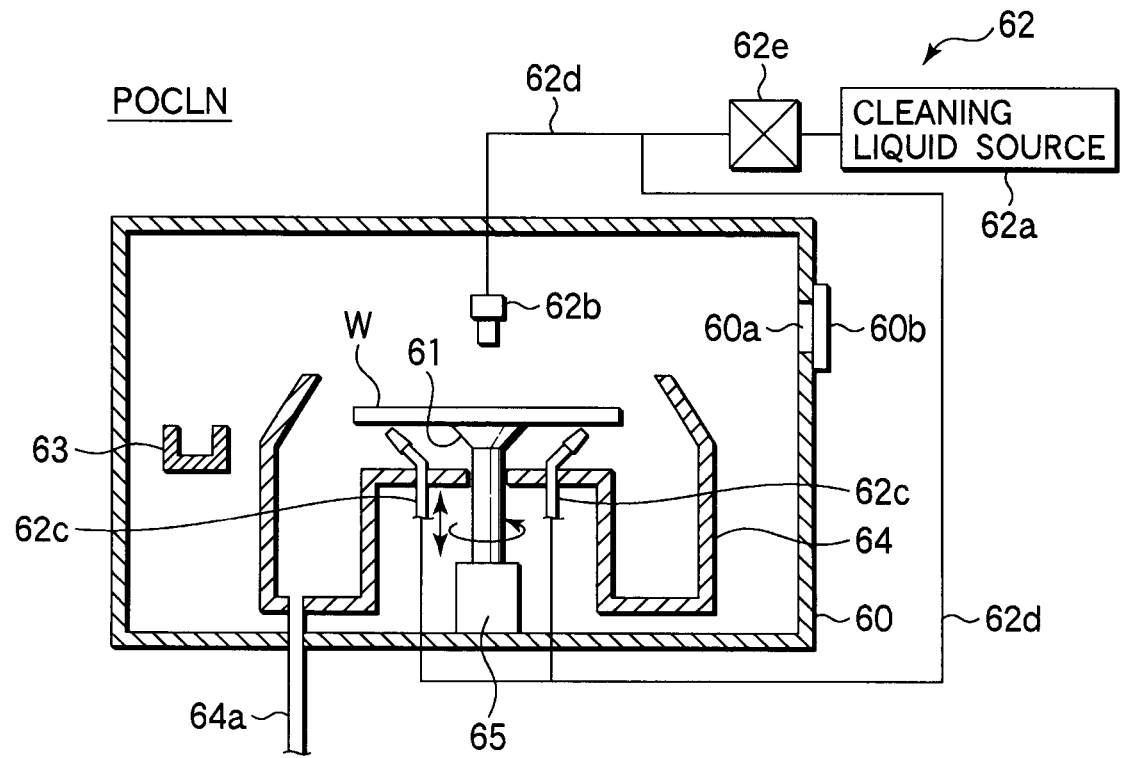
FIG. 4 is a sectional view schematically showing a post-cleaning unit disposed in the coating/developing apparatus.

As shown in the schematic sectional view of FIG. 4, the post-cleaning unit (POCLN) includes a casing 60 for accommodating a wafer W, and a spin chuck 61 located inside the casing 60 to hold and rotate the wafer W in a horizontal state. A cleaning liquid supply mechanism 62 is disposed to supply an alkyl alcohol, such as isopropyl alcohol or butyl alcohol, as a cleaning liquid onto the wafer W held by the spin chuck 61. A cup body 64 is disposed to receive a process liquid, such as a cleaning liquid, thrown off from the wafer W held by the spin chuck 61. The spin chuck 61 is rotated by a motor 65.

The casing 60 has a transfer port 60a formed in a sidewall thereof for transferring the wafer W into and from the casing 60 by the second wafer transfer mechanism 22. The transfer port 60a is provided with a shutter 60b for opening/closing the port. The spin chuck 61 is movable up and down, and is configured to hold the wafer W from the lower surface thereof by a vacuum attraction force, and to rotate the wafer W by the motor 65.

The cleaning liquid supply mechanism 62 includes a cleaning liquid source 62a for supplying an alkyl alcohol as a cleaning liquid. An upper side nozzle 62b is disposed to supply a cleaning liquid from the cleaning liquid source 62a onto the front surface (upper side) of the wafer W held by the spin chuck 61. Lower side nozzles 62b are disposed to supply a cleaning liquid from the cleaning liquid source 62a onto the back surface (lower side) of the wafer W held by the spin chuck 61. The cleaning liquid source 62a is connected to the upper side nozzle 62b and lower side nozzles 62c through conduit lines 62d. The conduit lines 62d are provided with a valve 62e for adjusting the flow rate of a cleaning liquid flowing therethrough. A waiting position 63 is prepared to set the upper side nozzle 62b in a waiting state.

The cup body 64 is configured to surround the wafer W held by the spin chuck 61 when the spin chuck 61 holding the wafer W is moved down. Further, the upper end side of the cup body 64 is inclined upward and inward to reliably receive a process liquid supplied from the lower side nozzles 62c, as well as a process liquid thrown off from the wafer W. A drain line 64a for discharging a process liquid received in the cup body 64 is connected to the bottom wall of the cup body 64.

Next, a detailed explanation will be given of the first drying unit (DRY1).

Figure 5:
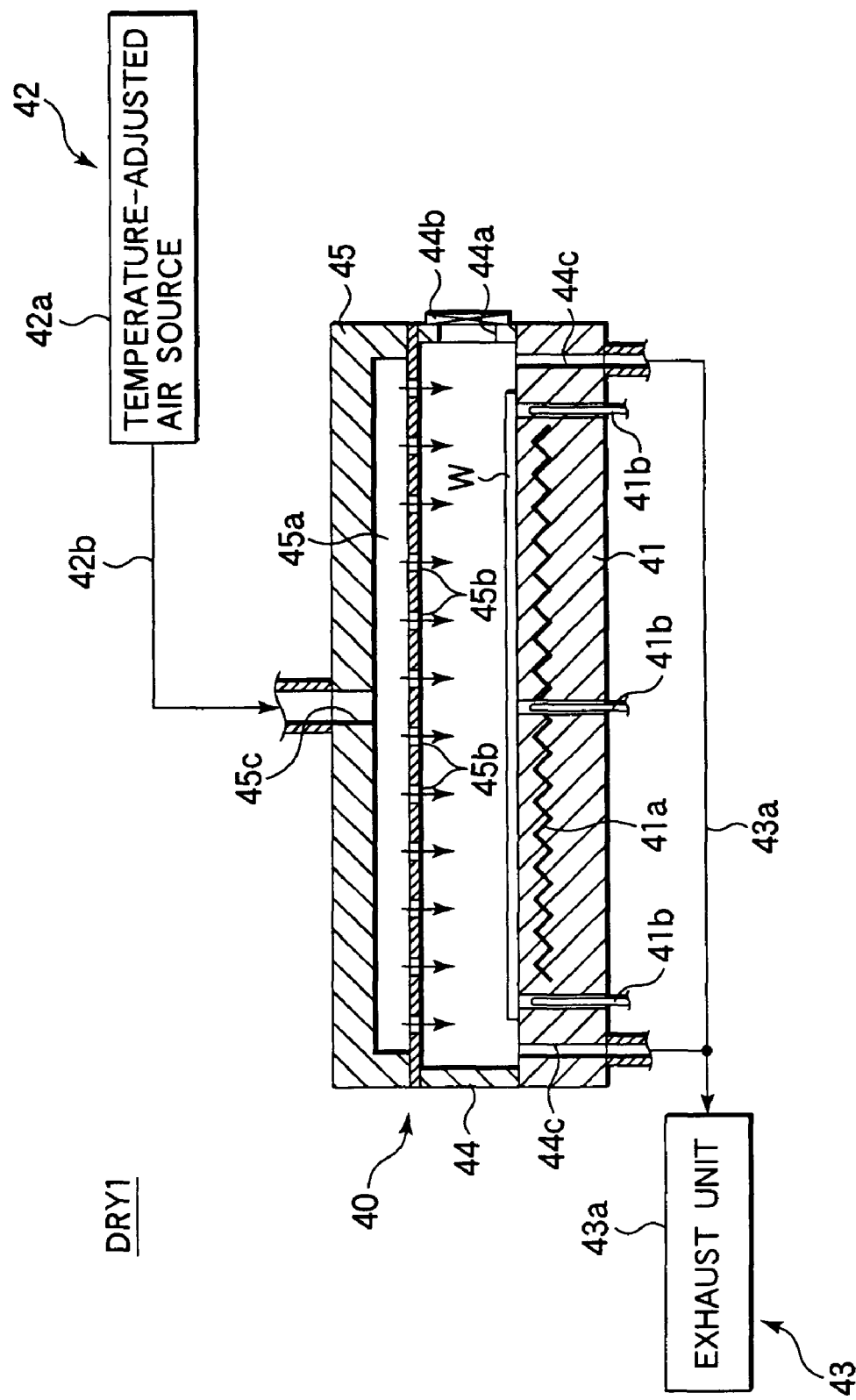
FIG. 5 is a sectional view schematically showing a first drying unit disposed in the coating/developing apparatus.

As shown in the schematic sectional view of FIG. 5, the first drying unit (DRY1) includes a process container or chamber 40 for accommodating a wafer W, and a substrate support member or support table 41 located inside the chamber 40 for placing the wafer W thereon. A temperature-adjusted gas supply mechanism or temperature-adjusted air supply mechanism 42 is disposed to supply a temperature-adjusted gas, such as temperature-adjusted air, onto the surface of the wafer W placed on the support table 41. An exhaust mechanism 43 is connected to the chamber 40 to exhaust gas from inside the chamber 40.

The chamber 40 includes a chamber main body 44, which is essentially cylindrical or box-like and has an opening at the top, and a lid 45 for closing the top opening of the chamber main body 44. The chamber main body 44 has a transfer port 44*a* formed in a sidewall thereof for transferring the wafer W into and from the chamber 40 by the second wafer transfer mechanism 22. The transfer port 44*a* is provided with a shutter 44*b* for opening/closing the port.

The chamber main body 44 has an exhaust port 44*c* formed in the bottom at, e.g., a position near the edge. The support table 41 is formed of, e.g., the central portion of the bottom of the chamber main body 44. The support table 41 is provided with means for adjusting temperature of the wafer W placed thereon, such as a heater 41*a* built therein for heating the wafer W. Further, the support table 41 is provided with support pins 41*b* movable up and down to be projected and retreated relative to the upper surface of the support table 41. The support pins 41*b* are set at a projected position when the wafer W is transferred between the second wafer transfer mechanism 22 and support pins 41*b*. The support pins 41*b* are set at a retreated position when the wafer W is placed on the support table 41.

The lid 45 is essentially cylindrical or box-like to define a flat diffusion space 45*a* therein. The lid 45 has a supply port 45*c* formed on the upper surface to supply temperature-adjusted air into the diffusion space 45*a* by the temperature-adjusted air supply mechanism 42. The lid 45 has a number of delivery holes 45*b* (temperature-adjusted air supply holes) formed on the lower surface to deliver temperature-adjusted air supplied into the diffusion space 45*a* toward the support table 41 (i.e., toward the surface of the wafer W placed on the support table 41) inside the chamber 40 (chamber main body 44).

The temperature-adjusted air supply mechanism 42 includes a temperature-adjusted air source 42*a* including, e.g., a heat exchanger and a blower fan. The temperature-adjusted air source 42*a* is connected to the diffusion space 45*a* of the lid 45 through a temperature-adjusted air supply line 42*b* for supplying temperature-adjusted air. The exhaust mechanism 43 includes an exhaust unit 43*b* connected to the exhaust port 44*c* through an exhaust line 43*a* to exhaust gas from inside the chamber 40.

Next, a detailed explanation will be given of the second drying unit (DRY2).

Figure 6:
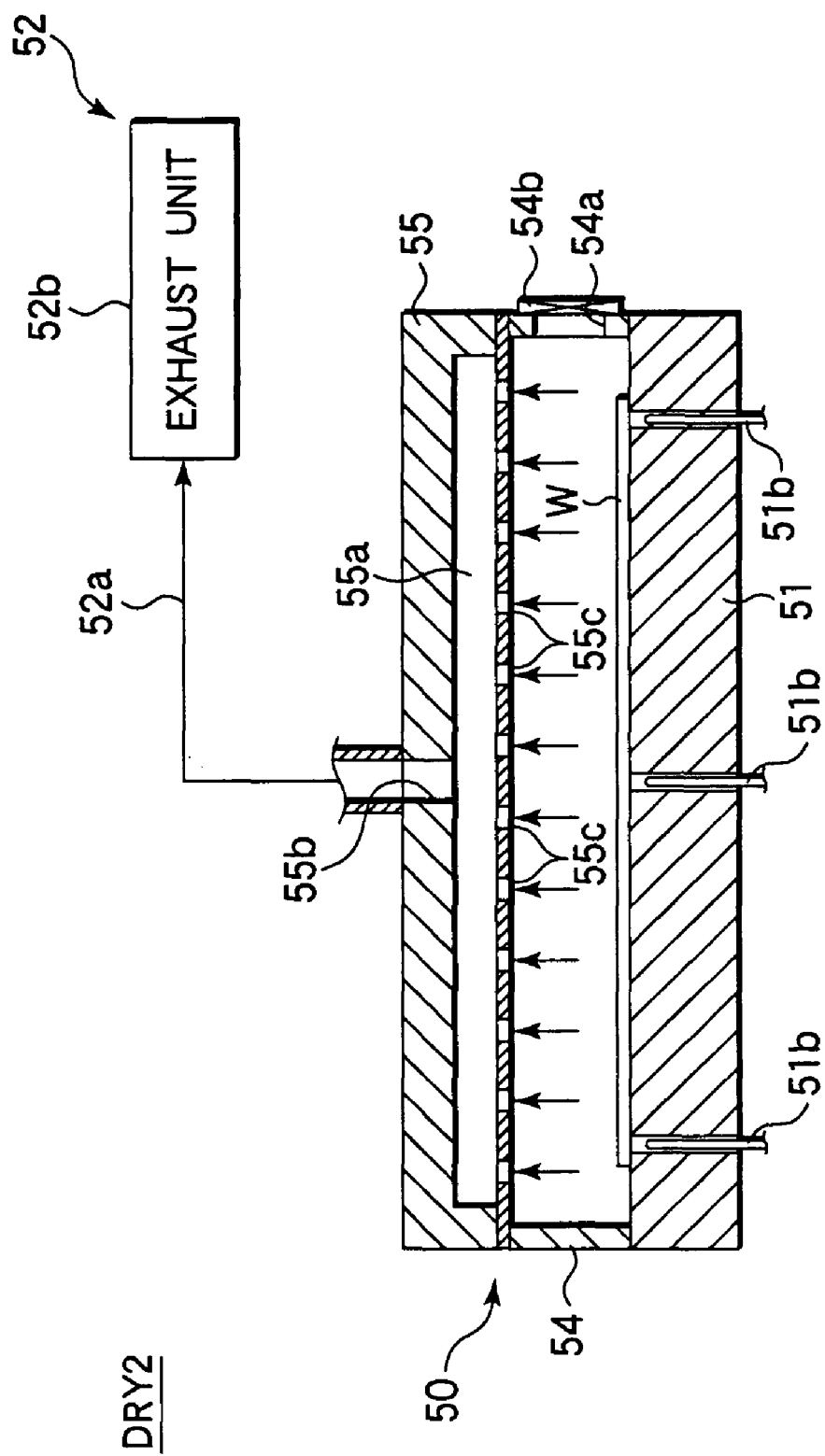
FIG. 6 is a sectional view schematically showing a second drying unit disposed in the coating/developing apparatus.

As shown in the schematic sectional view of FIG. 6, the second drying unit (DRY2) includes a process container or chamber 50 for accommodating a wafer W, and a substrate support member or support table 51 located inside the chamber 50 for placing the wafer W thereon. A pressure-decreasing mechanism 52 is disposed to decrease the pressure inside the chamber 50.

The chamber 50 includes a chamber main body 54, which is essentially cylindrical and has an opening at the top, and a lid 55 for closing the top opening of the chamber main body 54. The chamber main body 54 has a transfer port 54*a* formed in a sidewall thereof for transferring the wafer W into and from the chamber 50 by the second wafer transfer mechanism 22. The transfer port 54*a* is provided with a shutter 54*b* for opening/closing the port.

The support table 51 is formed of, e.g., the central portion of the bottom of the chamber main body 54. The support table 51 is provided with support pins 51*b* movable up and down to be projected and retreated relative to the upper surface of the support table 51. The support pins 51*b* are set at a projected position when the wafer W is transferred between the second wafer transfer mechanism 22 and support pins 51*b*. The support pins 51*b* are set at a retreated position when the wafer W is placed on the support table 51. The lid 55 has an exhaust port 55*b* and exhaust holes 55*c* formed on the upper surface and lower surface, respectively, which communicate with the flat space 55*a* and are used to exhaust gas from inside the chamber 50 (chamber main body 54). A number of exhaust holes 55*c* are formed to face the support table 51 (i.e., face the surface of the wafer W placed on the support table 51).

The pressure-decreasing mechanism 52 includes an exhaust unit 52*b* connected to the exhaust port 55*b* through an exhaust line 52*a* to exhaust gas from inside the chamber 50 to set the interior of the chamber 50 at about a vacuum pressure.

The first drying unit (DRY1) and second drying unit (DRY2) are selectively used in accordance with, e.g., process conditions for a wafer W.

The light exposure apparatus 3 is arranged to perform a so-called immersion light exposure process for subjecting a resist film formed on a wafer W to light exposure in accordance with a predetermined pattern, while immersing the resist film in a liquid, such as purified water. The light exposure apparatus 3 includes an incoming stage 14*a* for placing thereon wafers W transferred from the interface station 13, before the immersion light exposure process, and an outgoing stage 14*b* for placing thereon wafers W to be transferred to the interface station 13, after the immersion light exposure process.

Figure 7:
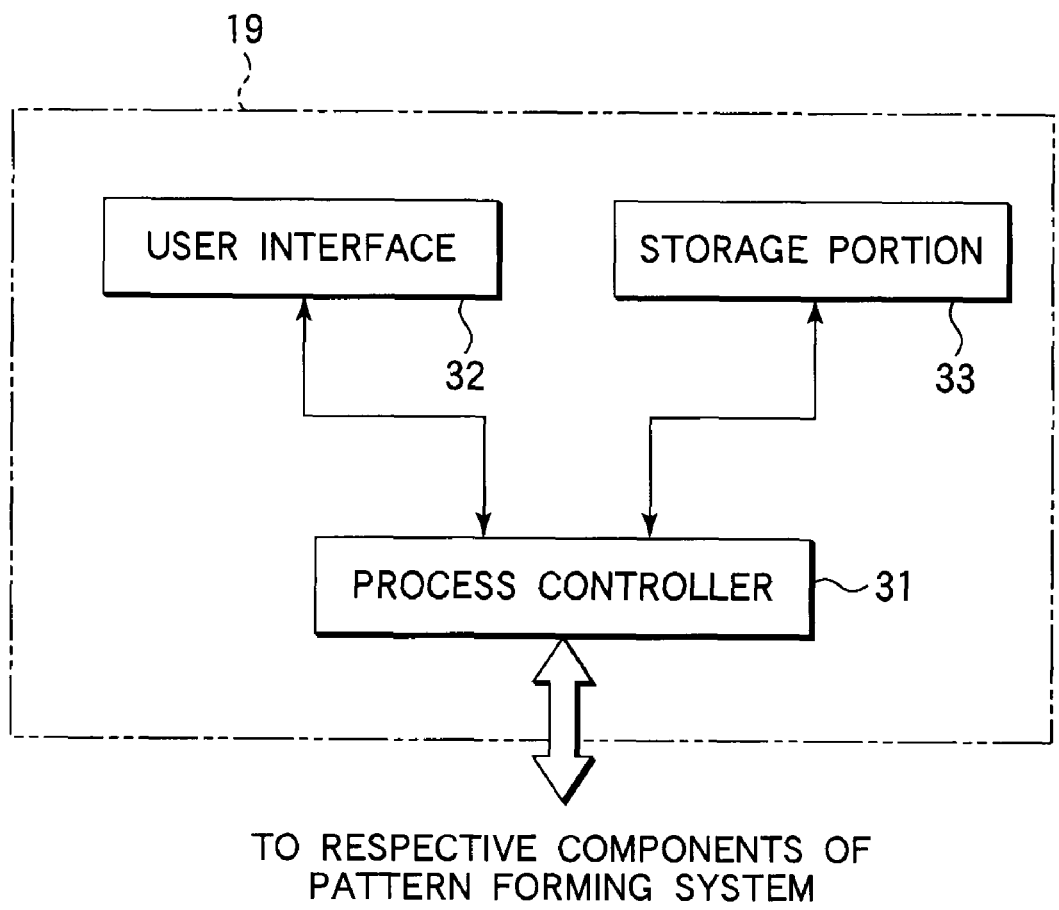
FIG. 7 is a block diagram showing a control section used in the pattern forming system.

As shown in FIG. 2, a control section 19 is located below the cassette station 11 and is used for controlling this pattern forming system 1, as a whole. As shown in the block diagram of FIG. 7, this control section 19 includes a process controller 31 comprising a micro processor (MPU) for controlling the respective components, such as processing units and transfer mechanisms, of the pattern forming system 1. The control section 19 further includes a user interface 32, which includes, e.g., a keyboard and a display, wherein the keyboard is used for an operator to input commands for operating the respective components of the pattern forming system 1, and the display is used for showing visualized images of the operational status of the respective components of the pattern forming system 1. The control section 19 further includes a storage portion 33, which stores data for performing processes.

The storage portion 33 stores various control programs for realizing various processes performed in the pattern forming system 1 under the control of the process controller 31. The storage portion 33 also stores a plurality of recipes with process condition data and process sequences recorded therein, and databases necessary for performing processes.

When a process is performed, a required recipe is retrieved from the storage portion 33 and executed by the process controller 31 in accordance with an instruction or the like input through the user interface 32. Consequently, each of various predetermined processes is performed in the pattern forming system 1 under the control of the process controller 31. Recipes may be stored in a computer readable storage medium, such as a CD-ROM, hard disk, flexible disk, or nonvolatile memory. Further, recipes may be utilized on-line, while it is transmitted from a suitable apparatus through, e.g., a dedicated line, as needed.

Next, process steps performed in the pattern forming system 1 will be explained.

In the pattern forming system 1 arranged as described above, wafers W are taken out one by one from a wafer cassette (CR) by the transfer pick 11*d* of the wafer transfer mechanism 11*c*. A wafer W thus taken out is transferred by the transfer pick 11*d* into the transit unit of the third processing unit group $G_3$ of the process station 12. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to an adhesion process in the adhesion unit, formation of a resist film in one of the resist coating units (COT), formation of a protection film in one of the top coating units (ITC), and a pre-baking process in the pre-baking unit in this order. In place of the adhesion process, the wafer W may be subjected to formation of an anti-reflective coating in one of the bottom coating units (BARC), or formation of an anti-reflective coating on a resist film and formation of a protection film on the anti-reflective coating.

After the wafer W is subjected to a series of processes in the process station 12, the wafer W is transferred into the transit unit of the fifth processing unit group $G_5$. Then, the wafer W is transferred by the first wafer transfer mechanism 21 into the high-precision temperature adjusting unit (CPL). Then, the wafer W is transferred by the second wafer transfer mechanism 22 into the pre-cleaning unit (PRECLN), in which the wafer W is subjected to cleaning. As needed, it may be arranged such that, before the wafer W is transferred to the pre-cleaning unit (PRECLN), the wafer W is transferred to the periphery light exposure unit (WEE), in which the wafer W is subjected to periphery light exposure, and is then transferred to the incoming buffer cassette (INBR).

After the cleaning is finished in the pre-cleaning unit (PRECLN), the wafer W is transferred by the second wafer transfer mechanism 22 into the high-precision temperature adjusting unit (CPL), in which the wafer W is adjusted to a predetermined temperature. Then, the wafer W is transferred by the second wafer transfer mechanism 22 to the incoming stage 14a of the light exposure apparatus 3. Then, the wafer W is subjected to an immersion light exposure process in the light exposure apparatus 3.

After the immersion light exposure process is finished in the light exposure apparatus 3, the wafer W is transferred to the outgoing stage 14b. Then, the wafer W is transferred by the second wafer transfer mechanism 22 into the post-cleaning unit (POCLN), in which the wafer W is subjected to cleaning. Since the post-cleaning unit (POCLN) is located in the second interface station 13b adjacent to the light exposure apparatus 3, this cleaning can be performed immediately after the immersion light exposure.

As shown in FIG. 4, at the post-cleaning unit (POCLN), the wafer W is transferred by the second wafer transfer mechanism 22 through the transfer port 60a into the casing 60. The spin chuck 61 is moved up, so that the wafer W is held on the spin chuck 61 by a vacuum attraction force. Then, the transfer port 60a is closed by the shutter 60b, and the spin chuck 61 is moved down, so that the wafer W is surrounded by the cup body 64. Then, while the wafer W is rotated by the spin chuck 61, a cleaning liquid is supplied from the cleaning liquid supply mechanism 62 onto the wafer W to perform cleaning on the wafer W. At this time, the supply of the cleaning liquid from the cleaning liquid supply mechanism 62 may be performed while the upper side nozzle 62b is moved from the center of the wafer W to the edge thereof, for example. With this operation, particles deposited on the wafer W are removed. Further, since the cleaning liquid comprises an alkyl alcohol, stains, water marks, and so forth generated on the wafer W during the immersion light exposure are dissolved and removed, and the contact angle of the protection film is decreased. Consequently, it is possible to solve a conventional problem in that stains, water marks, and so forth are generated when liquid is dried after it is divided into minute parts due to the liquid repellent (or hydrophobic) surface of the protection film. Further, with this cleaning, liquid components impregnated in the protection film and/or resist film during the immersion light exposure are replaced with the alkyl alcohol used as the cleaning liquid. Since the alkyl alcohol is low in boiling point and specific heat, i.e., it is high in volatility, a drying process can be efficiently performed on the wafer W, as described later.

Accordingly, the post-cleaning unit (POCLN) also servers as a drying assistant unit for supplying a medium that assists drying onto the wafer W immediately after the immersion light exposure process and before drying by the first drying unit (DRY1) or second drying unit (DRY2). The alkyl alcohol used as the cleaning liquid serves as a drying assistant medium for the wafer W.

In this embodiment, an alkyl alcohol having a high cleaning property is used as a cleaning liquid to remove particles deposited on a wafer W and to remove stains, water marks, and so forth generated on the wafer W during the immersion light exposure. Alternatively, an ether, such as ethyl ether, or a mixture of these materials may be used as a cleaning liquid. Further, an ether, such as ethyl ether, ozone, or a mixture of these materials may be used as a medium that assists drying of a wafer W, in place of an alkyl alcohol. Where a medium of this kind is used, the replacing effect is enhanced by setting the interior of the casing 60 at a vacuum pressure.

Further, an alcohol other than the alkyl alcohol, heated water, a liquid that can oxidize the protection film by ozone or the like, or a mixture of these materials may be used as a liquid for decreasing the contact angle of the protection film. In place of a liquid for decreasing the contact angle of the protection film, a liquid having a small surface tension, such as a liquid containing a surfactant, may be used to solve a problem in that stains, water marks, and so forth are generated when liquid is dried after it is divided into minute parts on the surface of the protection film.

Then, the supply of the cleaning liquid from the cleaning liquid supply mechanism 62 is stopped, and the wafer W is rotated by the spin chuck 61 to dry the wafer W to some extent. After the wafer W is dried to a certain extent and the rotation of the spin chuck 61 is stopped, the spin chuck 61 is moved up and the transfer port 60a is opened by the shutter 60b. Thereafter, the wafer W is transferred by the second wafer transfer mechanism 22 through the transfer port 60a out of the casing 60.

After the cleaning is finished in the post-cleaning unit (POCLN), the wafer W is transferred by the second wafer transfer mechanism 22 into the first drying unit (DRY1) or second drying unit (DRY2), in which the wafer W is subjected to drying.

As shown in FIG. 5, at the first drying unit (DRY1), the wafer W is transferred by the second wafer transfer mechanism 22 through the transfer port 44a into the chamber 40. Then, the support pins 41b are moved up to be projected from the upper surface of the support table 41, so that wafer W is received by the support pins 41b from the second wafer transfer mechanism 22. Then, the support pins 41b are moved down to be retreated into the support table 41, so that the wafer W is placed on the support table 41. Further, the second wafer transfer mechanism 22 is returned back out of the chamber 40, and the transfer port 44a is closed by the shutter 44b.

After the wafer W is placed on the support table 41 and the transfer port 44a is closed, a drying process is performed on the wafer W. At this time, while the interior of the chamber 40 is exhausted by the exhaust mechanism 43, a temperature-adjusted air is supplied from the temperature-adjusted air supply mechanism 42 into the chamber 40, and the heater 41a is adjusted to a predetermined temperature. The temperature of the temperature-adjusted air from the temperature-adjusted air supply mechanism 42 and the heating temperature of the heater 41*a* are set to prevent the resist film from causing a chemical amplification reaction. Specifically, the temperatures are set to be lower than the heating temperature of a post-exposure baking process described later, and, for example, set to be 40° C. or less, and preferably to be 25 to 30° C. The exhaust gas flow rate by the exhaust mechanism 43 is preferably set to be larger than the supply flow rate of the temperature-adjusted air from the temperature-adjusted air supply mechanism 42. With this arrangement, the chamber 40 and lid 45 are prevented from becoming unstable, and moisture vaporized from the wafer W is swiftly removed out of the chamber 40.

Unlike conventional drying processes, this drying process is performed by heating without rotation of the wafer W. Consequently, it is possible to prevent liquid droplets from remaining and/or prevent traces of remaining liquid droplets from being generated on the wafer W, and further to dry the wafer W in a short time.

After the drying of the wafer W is performed for a predetermined time, the supply of the temperature-adjusted air from the temperature-adjusted air supply mechanism 42 is stopped. Further, the heating by the heater 41*a* and the exhaust by the exhaust mechanism 43 are stopped. Then, the support pins 41*b* are moved up, so that the wafer W is received by the support pins 41*b* from the support table 41, and the transfer port 44*a* is opened by the shutter 44*b*. Then, the wafer W is received by the second wafer transfer mechanism 22 from the support pins 41*b*, and is transferred through the transfer port 44*a* out of the chamber 40.

As shown in FIG. 6, at the second drying unit (DRY2), the wafer W is transferred by the second wafer transfer mechanism 22 through the transfer port 54*a* into the chamber 50. Then, the support pins 51*b* are moved up to be projected from the upper surface of the support table 51, so that wafer W is received by the support pins 51*b* from the second wafer transfer mechanism 22. Then, the support pins 51*b* are moved down to be retreated into the support table 51, so that the wafer W is placed on the support table 51. Further, the second wafer transfer mechanism 22 is returned back out of the chamber 50, and the transfer port 54*a* is closed by the shutter 54*b*.

After the wafer W is placed on the support table 51 and the transfer port 54*a* is closed, a drying process is performed on the wafer W, while the interior of the chamber 50 is exhausted by the pressure-decreasing mechanism 52 to decrease the inner pressure to, e.g., about a vacuum pressure.

Unlike conventional drying processes, this drying process is performed by pressure-decreasing without rotation of the wafer W. Consequently, it is possible to prevent liquid droplets from remaining and/or prevent traces of remaining liquid droplets from being generated on the wafer W. Further, it is possible to remove liquid components, such as alkyl alcohol components, impregnated in the resist film and/or protection film.

After the drying of the wafer W is performed for a predetermined time, the pressure-decreasing by the pressure-decreasing mechanism 52 is stopped. Then, the support pins 51*b* are moved up, so that the wafer W is received by the support pins 51*b* from the support table 51, and the transfer port 54*a* is opened by the shutter 54*b*. Then, the wafer W is received by the second wafer transfer mechanism 22 from the support pins 51*b*, and is transferred through the transfer port 54*a* out of the chamber 50.

According to this embodiment, since the first drying unit (DRY1) and second drying unit (DRY2) are located adjacent to the post-cleaning unit (POCLN) in the second interface station 13*b*, the drying can be performed immediately after the cleaning in the post-cleaning unit (POCLN). Further, each of the first drying unit (DRY1) and second drying unit (DRY2) is arranged to dry a wafer W without throwing-off by rotation, unlike conventional drying processes. Consequently, it is possible to prevent liquid droplets from remaining, as described above, and thus is possible to improve the quality of a developing process described later.

The first drying unit (DRY1) is arranged to dry a wafer W by heating, while the second drying unit (DRY2) is arranged to dry a wafer W by pressure-decreasing to, e.g., about a vacuum pressure, so that they can be selectively used in accordance with process conditions for a wafer W. The first drying unit (DRY1) may be used, for example, where the heating temperature of a post-exposure baking process described later is high, or drying of a wafer W needs to be completed in a short time, as described above. The second drying unit (DRY2) may be used, for example, where the heating temperature of a post-exposure baking process described later is low, or liquid components impregnated in a resist film and so forth need to be removed, as described above.

In each of the first drying unit (DRY1) and second drying unit (DRY2), the delivery holes 45*b* for delivering temperature-adjusted air or the exhaust holes 55*c* for exhausting gas from inside the chamber 50 are formed to face the surface of the wafer W. Consequently, it is possible to efficiency dry the protection film and resist film, and thus is possible to improve the quality of a developing process described later.

The post-cleaning unit (POCLN) is arranged to perform cleaning by use of an alkyl alcohol, so that liquid components deposited on a wafer W and impregnated in the resist film and/or protection film are replaced with the alkyl alcohol, which is volatile. The alkyl alcohol is evaporated during the process in the first drying unit (DRY1) or second drying unit (DRY2), thereby drying the wafer W in a short time. Consequently, it is possible to further improve the quality of a developing process described later.

Further, stains, water marks, and so forth generated on a wafer W during the immersion light exposure are dissolved and removed by the alkyl alcohol. Consequently, it is possible to further improve the quality of a developing process described later.

Further, the contact angle of the protection film is decreased by the alkyl alcohol, thereby solving a problem caused by the surface of the protection film such that liquid droplets are divided into minute parts thereon and generate stains, water marks, and so forth. Consequently, it is possible to further improve the quality of a developing process described later.

In this embodiment, after the immersion light exposure process is finished in the light exposure apparatus 3, cleaning is performed in the post-cleaning unit (POCLN), and drying is then performed in the first drying unit (DRY1) or second drying unit (DRY2). However, where the unclean level of a wafer W is low after the immersion light exposure process, drying may be performed in the first drying unit (DRY1) or second drying unit (DRY2), without cleaning in the post-cleaning unit (POCLN). Also in this case, since the first drying unit (DRY1) and second drying unit (DRY2) are located in the second interface station 13*b* adjacent to the light exposure apparatus 3, the drying can be performed immediately after the immersion light exposure. Consequently, also in this case, it is possible to prevent liquid droplets from remaining and/or prevent traces of remaining liquid droplets from being generated on the wafer W, and further to improve the quality of a developing process described later.

After the drying is performed in the first drying unit (DRY1) or second drying unit (DRY2), the wafer W is transferred by the second wafer transfer mechanism 22 into the high-precision temperature adjusting unit (CPL). Further, the wafer W is transferred by the first wafer transfer mechanism 21 into the transit unit of the fifth processing unit group $G_5$. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to a post-exposure baking process in the post-exposure baking unit, a developing process in one of the development units (DEV), and a post-baking process in the post-baking unit in this order. Then, the wafer W is transferred to the transit unit of the third processing unit group $G_3$, and is further transferred to a wafer cassette (CR) placed on the cassette station 11.

In a manner according to the embodiment described above, immediately after a substrate is subjected to an immersion light exposure process, the substrate is loaded into a process container and is placed on a substrate support member. Then, the substrate is dried by supplying a temperature-adjusted gas into the process container, while exhausting the interior of the process container. At this time, liquid deposited on the substrate is evaporated to prevent liquid droplets from remaining or prevent traces of remaining liquid droplets from being generated. Consequently, the development quality can be improved.

In a manner according to the embodiment described above, immediately after a substrate is subjected to an immersion light exposure process, the substrate is loaded into a process container and is placed on a substrate support member. Then, the substrate is dried by decreasing the pressure inside the process container. At this time, liquid deposited on the substrate is evaporated to prevent liquid droplets from remaining or prevent traces of remaining liquid droplets from being generated. Further, liquid components impregnated in a resist film and so forth on the substrate are removed. Consequently, the development quality can be effectively improved.

The present invention is not limited to the embodiment described above, and it may be modified in various manners. For example, in the embodiment described above, the coating/developing apparatus includes the first drying unit arranged to dry a wafer W by heating, and the second drying unit (DRY2) arranged to dry a wafer W by pressure-decreasing to about a vacuum pressure. Alternatively, the coating/developing apparatus may include only one of the first drying unit and second drying unit. In the embodiment described above, the drying process of a wafer is performed by one of the heating and the pressure-decreasing to about a vacuum pressure. However, the heating and the pressure-decreasing to about a vacuum pressure may be used in combination.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating/developing apparatus to be disposed adjacent to an immersion light exposure apparatus arranged to subject a resist film formed on a substrate to light exposure while immersing the resist film in a liquid, the coating/developing apparatus being used for applying a resist liquid onto the substrate to form the resist film, and for performing a developing process on the resist film treated by an immersion light exposure process in the immersion light exposure apparatus, the coating/developing apparatus comprising:
    a process section including a plurality of processing units configured to perform a series of processes for resist coating and development;
    an interface section disposed between the process section and the immersion light exposure apparatus;
    a drying section disposed in the interface section and configured to dry the substrate after the immersion light exposure process; and
    a post-light exposure cleaning unit disposed in the interface section and having a cleaning liquid supply mechanism configured to supply a cleaning liquid onto the substrate after the immersion light exposure process and before the drying section dries the substrate,
    wherein the drying section includes
        a process container configured to accommodate the substrate,
        a substrate support member configured to place the substrate thereon inside the process container,
        a temperature-adjusted gas supply mechanism configured to supply a temperature-adjusted gas into the process container, and
        an exhaust mechanism configured to exhaust an interior of the process container,
    wherein the drying section is arranged to dry the substrate by supplying the gas from the temperature-adjusted gas supply mechanism into the process container with the substrate placed on the substrate support member, while exhausting the interior of the process container by the exhaust mechanism,
    wherein the process section includes a protection film forming unit configured to form a protection film on the resist film formed on the substrate, before the immersion light exposure process, and
    wherein the cleaning liquid supply mechanism is configured to supply the protection film formed on the substrate with the cleaning liquid, which is a cleaning liquid having a function of decreasing a contact angle of the protection film or a cleaning liquid having a surface tension.

2. The coating/developing apparatus according to claim 1, wherein the temperature-adjusted gas supply mechanism has temperature-adjusted gas supply holes formed at an upper position inside the process container to face the substrate placed on the substrate support member, such that the gas is supplied through the temperature-adjusted gas supply holes.

3. The coating/developing apparatus according to claim 1, wherein the substrate support member is configured to perform heating, and the drying section is arranged to dry the substrate by supplying the gas from the temperature-adjusted gas supply mechanism, while heating the substrate support member.

4. The coating/developing apparatus according to claim 1, wherein the process section includes a post-light exposure baking unit configured to perform a heating process on the substrate dried after the immersion light exposure process and before the developing process, and the drying section is arranged to use a substrate process temperature lower than a substrate process temperature used in the post-light exposure baking unit.

5. The coating/developing apparatus according to claim 1, further comprising a drying assistant unit disposed in the interface section and configured to supply a drying assistant medium on the substrate before the drying section dries the substrate.

6. The coating/developing apparatus according to claim 5, wherein the drying assistant medium contains at least one of an alkyl alcohol, an ether, and ozone.

7. The coating/developing apparatus according to claim 5, wherein the drying assistant unit is arranged to supply the drying assistant medium onto the substrate cleaned by the cleaning liquid supply mechanism.

8. The coating/developing apparatus according to claim 1, wherein the cleaning liquid supply mechanism is configured to supply a cleaning liquid containing at least one of an alkyl alcohol and an ether, onto the substrate.

9. The coating/developing apparatus according to claim 1, wherein the cleaning liquid having a function of decreasing a contact angle of the protection film contains at least one of heated water, an alcohol, and a liquid having a function of oxidizing the protection film, and wherein the cleaning liquid having a surface tension contains a surfactant.

10. A coating/developing apparatus to be disposed adjacent to an immersion light exposure apparatus arranged to subject a resist film formed on a substrate to light exposure while immersing the resist film in a liquid, the coating/developing apparatus being used for applying a resist liquid onto the substrate to form the resist film, and for performing a developing process on the resist film treated by an immersion light exposure process in the immersion light exposure apparatus, the coating/developing apparatus comprising:

a process section including a plurality of processing units configured to perform a series of processes for resist coating and development;

an interface section disposed between the process section and the immersion light exposure apparatus;

a drying section disposed in the interface section and configured to dry the substrate after the immersion light exposure process; and a post-light exposure cleaning unit disposed in the interface section and having a cleaning liquid supply mechanism configured to supply a cleaning liquid onto the substrate after the immersion light exposure process and before the drying section dries the substrate, wherein the drying section includes
a process container configured to accommodate the substrate,
a substrate support member configured to place the substrate thereon inside the process container, and
a pressure-decreasing mechanism configured to decrease a pressure inside the process container, wherein the drying section is arranged to use the pressure-decreasing mechanism to dry the substrate, by decreasing a pressure inside the process container with the substrate placed on the substrate support member, wherein the process section includes a protection film forming unit configured to form a protection film on the resist film formed on the substrate, before the immersion light exposure process, and wherein the cleaning liquid supply mechanism is configured to supply the protection film formed on the substrate with the cleaning liquid, which is a cleaning liquid having a function of decreasing a contact angle of the protection film or a cleaning liquid having a surface tension.

11. A pattern forming method for forming a predetermined resist pattern on a substrate, the method comprising:

applying a resist onto the substrate, thereby forming a resist film;

performing immersion light exposure in accordance with a predetermined pattern on the resist film formed on the substrate, while immersing the resist film in a liquid;

forming a protection film on the resist film formed on the substrate, before the immersion light exposure process;

drying the substrate after the immersion light exposure;

cleaning the substrate with a cleaning liquid after the immersion light exposure and before the drying, such that the cleaning includes supplying the protection film formed on the substrate with the cleaning liquid, which is a cleaning liquid having a function of decreasing a contact angle of the protection film or a cleaning liquid having a surface tension; and performing development on the resist film after the drying, wherein the drying includes supplying a temperature-adjusted gas into a process container with the substrate placed on a substrate support member therein, while exhausting the interior of the process container.

12. The pattern forming method according to claim 11, wherein the temperature-adjusted gas is supplied through temperature-adjusted gas supply holes formed at an upper position inside the process container to face the substrate placed on the substrate support member.

13. The pattern forming method according to claim 11, wherein the drying comprises supplying the temperature-adjusted gas while heating the substrate support member.

14. The pattern forming method according to claim 11, wherein the method further comprises performing post-light exposure baking of performing a heating process on the substrate after the drying and before the development, and the drying is arranged to use a substrate process temperature lower than a substrate process temperature used in the post-light exposure baking.

15. The pattern forming method according to claim 11, wherein the method further comprises supplying a drying assistant medium onto the substrate after the cleaning and before the drying.

16. The pattern forming method according to claim 15, wherein the drying assistant medium contains at least one of an alkyl alcohol, an ether, and ozone.

17. The pattern forming method according to claim 11, wherein the cleaning liquid contains at least one of an alkyl alcohol and an ether.

18. The pattern forming method according to claim 11, wherein the cleaning liquid having a function of decreasing a contact angle of the protection film contains at least one of heated water, an alcohol, and a liquid having a function of oxidizing the protection film, and wherein the cleaning liquid having a surface tension contains a surfactant.

19. A pattern forming method for forming a predetermined resist pattern on a substrate, the method comprising:

applying a resist onto the substrate, thereby forming a resist film;

performing immersion light exposure in accordance with a predetermined pattern on the resist film formed on the substrate, while immersing the resist film in a liquid;

forming a protection film on the resist film formed on the substrate, before the immersion light exposure process;

drying the substrate after the immersion light exposure;

cleaning the substrate with a cleaning liquid after the immersion light exposure and before the drying, such that the cleaning includes supplying the protection film formed on the substrate with the cleaning liquid, which is a cleaning liquid having a function of decreasing a contact angle of the protection film or a cleaning liquid having a surface tension; and performing development on the resist film after the drying, wherein the drying includes using pressure-decreasing to dry the substrate, by decreasing a pressure inside a process container with the substrate placed on a substrate support member therein.

20. A non-transitory computer readable storage medium that stores a control program for execution on a computer, the control program, when executed, causing the computer to control a processing apparatus to conduct a pattern forming method comprising:

applying a resist onto the substrate, thereby forming a resist film;

performing immersion light exposure in accordance with a predetermined pattern on the resist film formed on the substrate, while immersing the resist film in a liquid;

forming a protection film on the resist film formed on the substrate, before the immersion light exposure process;

drying the substrate after the immersion light exposure;

cleaning the substrate with a cleaning liquid after the immersion light exposure and before the drying, such that the cleaning includes supplying the protection film formed on the substrate with the cleaning liquid, which is a cleaning liquid having a function of decreasing a contact angle of the protection film or a cleaning liquid having a surface tension; and performing development on the resist film after the drying, wherein the drying includes supplying a temperature-adjusted gas into a process container with the substrate placed on a substrate support member therein, while exhausting the interior of the process container.

* * * * *